United States Patent [19]
Akaogi

[11] Patent Number: 5,402,383
[45] Date of Patent: Mar. 28, 1995

[54] ELECTRICALLY ERASABLE NON-VOLATILE SEMICONDUCTOR MEMORY DEVICE FOR SELECTIVE USE IN BOOT BLOCK TYPE OR NORMAL TYPE FLASH MEMORY DEVICES

[75] Inventor: Takao Akaogi, Kawasaki, Japan
[73] Assignee: Fujitsu Limited, Kawasaki, Japan
[21] Appl. No.: 78,818
[22] Filed: Jun. 21, 1993

[30] Foreign Application Priority Data

Oct. 6, 1992 [JP] Japan ................... 4-267413

[51] Int. Cl.⁶ .............................................. G11C 13/00
[52] U.S. Cl. ................................... 365/218; 365/900
[58] Field of Search .............. 365/900, 189.01, 230.01, 365/230.03, 218

[56] References Cited

U.S. PATENT DOCUMENTS 4,658,377 4/1987 McElroy ........................ 365/189.01
5,065,364 11/1991 Atwood et al. .

OTHER PUBLICATIONS

"Das andere Speichermedium Flash-Speicher als Ersatz für ROMs, SRAMs, DRAMs und mechanische Laufwerke", Moosburger, Elektronik, vol. 14, No. 17, Aug. 18, 1992, pp. 77–82.
"28F001BX-T/28F001BX-B 1M (128Kx8) CMOS Flash Memory", Advance Information, Intel Corporation, Mar. 1991, pp. 1–27.

*Primary Examiner*—Terrell W. Fears
*Attorney, Agent, or Firm*—Nikaido, Marmelstein, Murray & Oram

[57] ABSTRACT

An electrically erasable non-volatile semiconductor memory device has a memory cell array, a first erase unit, a second erase unit, and an operation mode establish unit. The erasing operation of the second erase unit is independently carried out of the erasing operation of the first erase unit. When a first operation mode is established by the operation mode establish unit, the second erase unit is inactivated, and the erasing operation of the memory cell array is only carried out by the first erase unit. On the other hand, when a second operation mode is established by the operation mode establish unit, the erasing operation of the first erase unit for a part of the memory cell array is disable, and the second erase unit is activated and the erasing operation for the part of the memory cell array is carried out by the second erase unit. Therefore, the change between a boot block type flash memory and normal type flash memory can be realized only by changing an establish value of the operation mode establish unit. Consequently, when developing both boot block type flash memory and normal type flash memory, these two types of flash memories can be obtained by using the same chip or by carrying out only minimum changes, so that the developing processes can be greatly decreased.

11 Claims, 13 Drawing Sheets

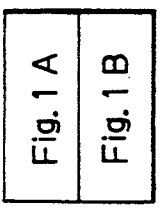
*Fig. 1A*
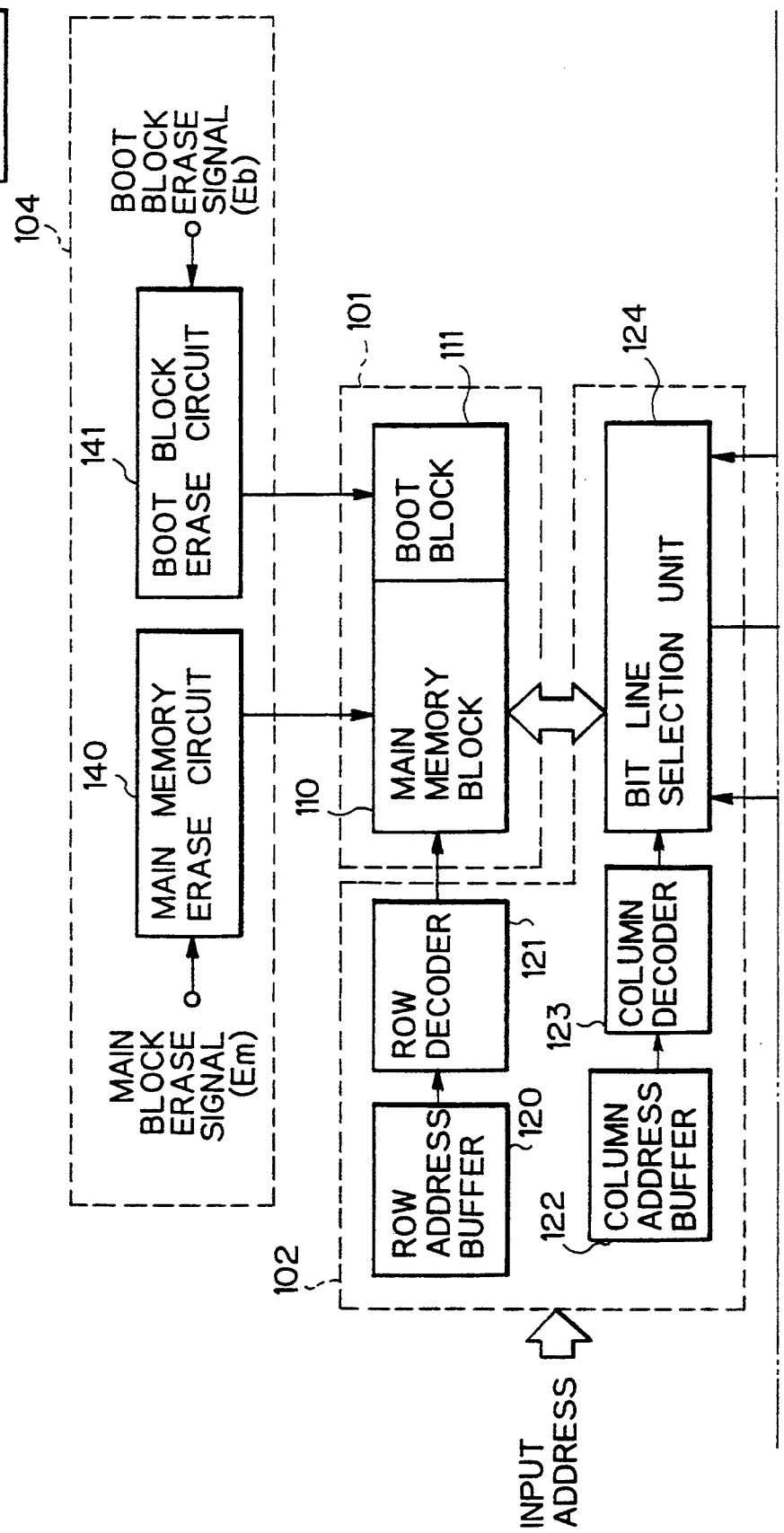

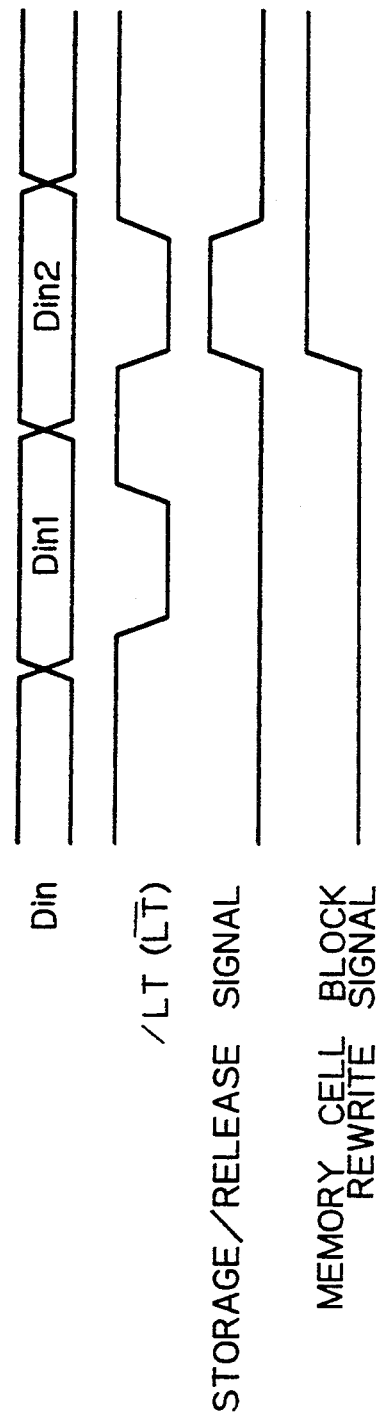

ELECTRICALLY ERASABLE NON-VOLATILE SEMICONDUCTOR MEMORY DEVICE FOR SELECTIVE USE IN BOOT BLOCK TYPE OR NORMAL TYPE FLASH MEMORY DEVICES

BACKGROUND OF THE INVENTION

1. Field of the Invention

The present invention relates to a semiconductor memory device, and more particularly, to a non-volatile semiconductor memory device such a flash type EEPROM (Electrically Erasable Programmable Read Only Memory, and hereafter called a flash memory), and the like. In this flash memory, stored information (data) is electrically and collectively erasable, and then the stored information can be rewritten.

2. Description of the Related Art

Recently, in accordance with popularization of computers, word processors, and the like, a plurality of semiconductor memory devices, typically non-volatile semiconductor memory devices, e.g., flash memory, used in such information processors, have been developed and produced.

The flash memory, which is one kind of non-volatile semiconductor memory device, can be made programmable by the user. Further, the flash memory can be rewritten by electrically and collectively erasing the stored data, and then by programming. In recent years, a flash memory having a boot block (boot block type flash memory) has been also developed. In this boot block type flash memory, a special memory area (boot block), which can only be rewritten in a special manner, is provided. Note, in the boot block, for example, a BIOS (Basic Input Output System), OS (operating system), and the like, can be stored.

Nevertheless, in the boot block type flash memory, a memory area corresponding to the boot block is constituted by hardware, and thus when providing a normal type flash memory not having a boot block and having a storage capacity corresponding to the total storage capacity of the boot block type flash memory, a different chip must be designed. Therefore, when providing both boot block type flash memory and normal type flash memory, development efficiency for the two types of flash memory becomes low, and thus the cost thereof cannot be decreased.

Further, when providing the boot block type flash memory as a normal type flash memory not having a boot block, a storage capacity of the normal type flash memory is specified as a storage capacity excluding the boot block in the boot block type flash memory. Namely, when using the boot block type flash memory as a normal type flash memory, the boot block cannot be used, and the storage capacity thereof becomes small.

SUMMARY OF THE INVENTION

An object of the present invention is to provide a boot block type flash memory which can be used as a normal type flash memory by carrying out a minimum of changes in the construction thereof.

According to the present invention, there is provided an electrically erasable non-volatile semiconductor memory device comprising a memory cell array having a plurality of memory cells; a first erase unit for erasing information stored in the memory cell array; a second erase unit for erasing information stored in the memory cell array, and the erasing operation of the second erase unit being independently carried out of the erasing operation of the first erase unit; and an operation mode establish unit for establishing one operation mode from first and second operation modes; wherein when the first operation mode is established, the second erase unit is inactivated, and the erasing operation of the memory cell array is only carried out by the first erase unit; and when the second operation mode is established, the erasing operation of the first erase unit for a part of the memory cell array is disable, and the second erase unit is activated and the erasing operation for the part of the memory cell array is carried out by the second erase unit.

The memory cell array may comprise a first memory cell array having a predetermined storage capacity and including a plurality of memory cells, and a second memory cell array having a predetermined storage capacity smaller than that of the first memory cell array, for replacing an optional address area of the first memory cell array; the electrically erasable non-volatile semiconductor memory device may further comprise a cell selection unit, connected to the first memory cell array and the second memory cell array, for selecting a memory cell in the first memory cell array or the second memory cell array; a cell read unit, connected to the cell selection unit, for reading information from the memory cell selected by the cell selection unit; a first write unit, connected to the cell selection unit, for writing information into the memory cell selected by the cell selection unit; and a second write unit, connected to the cell selection unit, for writing information into the second memory cell array; the operation mode establish unit may be connected to the cell selection unit and used to establish one operation mode from first and second operation modes, the first operation mode only using the first memory cell array, and the second operation mode using both of the first memory cell array and the second memory cell array; when the first operation mode is established by the operation mode establish unit, the cell selection unit only accesses the first memory cell array as a selection target; and when the second operation mode is established by the operation mode establish unit, the optional address area of the first memory cell array is replaced by the second memory cell array as a boot block, and the cell selection unit accesses both of the first memory cell array and the second memory cell array.

The electrically erasable non-volatile semiconductor memory device may further comprise an activation unit for controlling the activation of the second erase unit and the second write unit. The activation unit may be connected to an external terminal, and when a high voltage higher than a normal high power supply voltage is applied to the external terminal, the activation unit controls the first erase unit to be inactivated, and the second erase unit and the second write unit to be activated, and thereby a rewrite operation of the second memory cell array is carried out. The activation unit may be connected to external terminals, and when specific data are continuously applied to the external terminals, the activation unit control the first erase unit to be inactivated, and the second erase unit and the second write unit to be activated, and thereby a rewrite operation of the second memory cell array is carried out.

The cell selection unit may comprise a row address buffer, a row decoder connected to the row address buffer for selecting a word line of the first memory cell array and the second memory cell array, a column address buffer, a column decoder connected to the column address buffer, a first bit line selection unit connected to the first memory cell array for selecting a bit line in the first memory cell array, and a second bit line selection unit connected to the second memory cell array for selecting a bit line in the second memory cell array. The cell read unit may be connected to the first bit line selection unit and the second bit line selection unit, the first write unit may be connected to the first bit line selection unit, and the second erase unit may be connected to the second bit line selection unit. The operation mode establish unit may comprise a mode establish unit connected to an external terminal, mode information storing unit connected to the mode establish unit and the column address buffer for storing mode information, and a boot block decoder connected to the mode information storing unit and the second bit line selection unit.

The mode information storing unit may compare n-bit addresses in accordance with a storage release signal or storage signal input from the mode establish unit. The mode information storing unit may include address comparison circuits each having a memory cell transistor for comparing whether or not an input address is coincident with boot block address information stored in the memory cell transistor. The mode information storing unit may include address comparison circuits each having a fuse element for comparing whether or not an input address is coincident with boot block address information determined by the fuse element.

BRIEF DESCRIPTION OF THE DRAWINGS

The present invention will be more clearly understood from the description of the preferred embodiments as set forth below with reference to the accompanying drawings, wherein:

FIG. 11 is a waveform diagram for explaining an operation of the memory cell block rewrite control unit shown in FIG. 10.

DESCRIPTION OF THE PREFERRED EMBODIMENTS

For a better understanding of the preferred embodiments, the problems of the related art will be explained, with reference to FIG. 1.

Figure 1B:
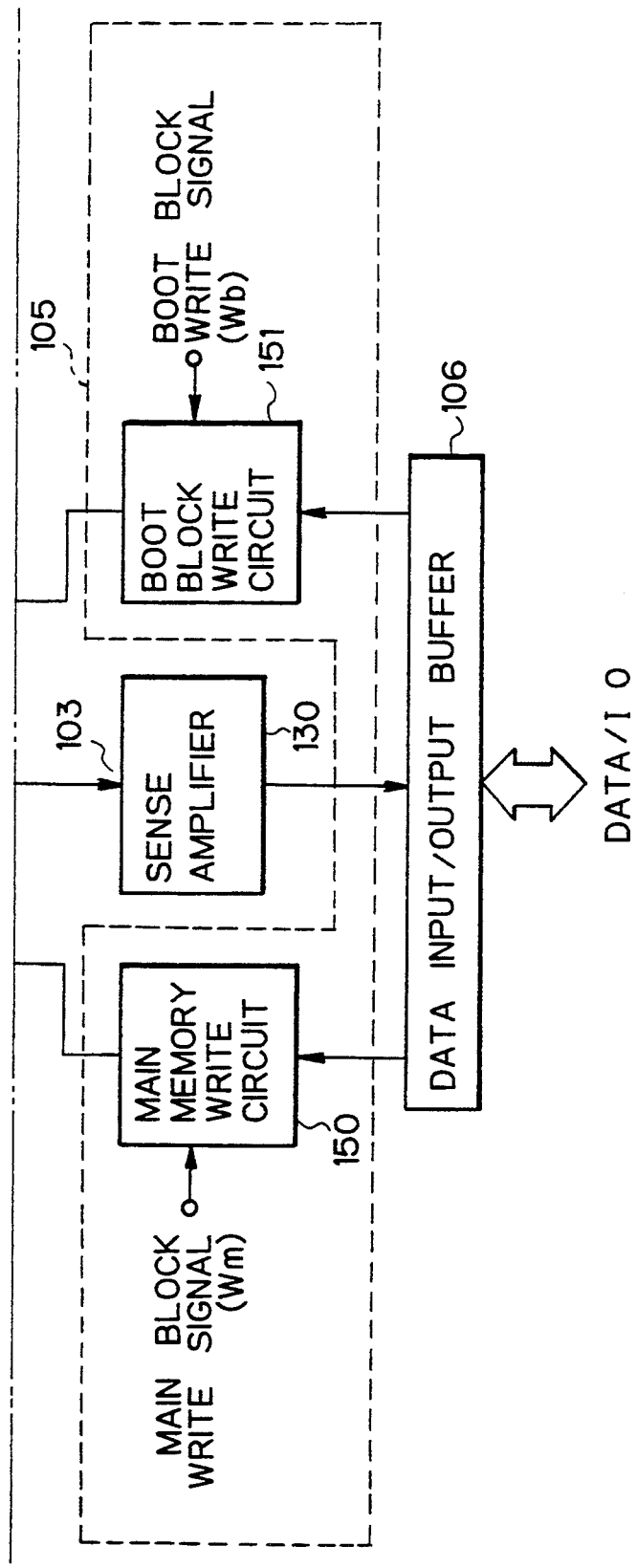
FIG. 1, consisting of FIGS. 1A and 1B, is a block diagram showing a schematic construction of an example of a semiconductor memory device according to the related art.

FIG. 1 shows a schematic construction of an example of a semiconductor memory device (electrically erasable non-volatile semiconductor memory device) according to the related art, more particularly, FIG. 1 shows a boot block type flash memory of the related art. Note. FIG. 1 consists of FIGS. 1A and 1B.

As shown in FIG. 1, the boot block type flash memory of the related art schematically comprises a memory cell unit 101, memory cell selection unit 102, memory cell read unit 103, memory cell erase unit 104, memory cell write unit 105, and data input-output buffer 106.

The memory cell unit 101 includes a memory cell array having a plurality of memory cells arranged in a matrix-constitution to store information (data). Namely, the memory cell unit 101 comprises a main memory block 110 and boot block 111, and the main memory block 110 is erased by a normal erase operation and the boot block 111 is erased by a special erase operation. Note, storage capacity of the main memory block 110 is determined by a difference obtained by subtracting a storage capacity of the boot block 111 from a predetermined storage capacity (total storage capacity) of the memory cell unit 101. Further, a special program (for example, BIOS, OS, and the like), which is not usually erased and rewritten, is stored in the boot block 111.

The memory cell selection unit 102, which receives input address signals, comprises a row address buffer 120, row decoder 121, column address buffer 122, column decoder 123, and bit line selection unit 124. This memory cell selection unit 102 is used to select a specific memory cell in the memory cell unit 101 in accordance with the address signals input from an external source. The memory cell read unit 103 comprises a sense amplifier 130, and this sense amplifier 130 is used to read information of the memory cell selected by the memory cell selection unit 102 in a read operation.

The memory cell erase unit 104 comprises a main memory erase unit 140 and boot block erase unit 141. The main memory erase unit 140 is used to erase information stored in the main memory block 110 in accordance with a main block erase signal Em, and the boot block erase unit 141 is used to erase information stored in the boot block 111 in accordance with a boot block erase signal Eb. Similarly, the memory cell write unit 105 comprises a main memory write unit 150 and boot block write unit 151. The main memory write unit 150 is used to write information into the main memory block 110 in accordance with a main memory write signal Wm, and the boot block write unit 151 is used to write information into the boot block 111 in accordance with a boot block write signal Wb.

In the above described configurations, for example, important information such as a BIOS or OS, where an erase operation is difficult to carry out and frequency of rewriting is low, is stored in the boot block 111. In normal use, a user only rewrites the information stored in the main memory block 110 by using the main memory erase circuit 140 and the main memory write circuit 150 in accordance with the main block erase signal Em and main block write signal Eb.

When the contents of the boot block 111 is to be changed, for example, the BIOS is to be changed, the information stored in the boot block 111 is rewritten by using the boot block erase circuit 141 and the boot block write circuit 151 in accordance with the boot block erase signal Eb and boot block write signal Wb.

Consequently, a flash memory (boot block type flash memory) having a boot block 111 which cannot be erased by a normal erase operation is realized. Nevertheless, in the related art semiconductor memory device as described above, a special memory unit, which cannot be rewritten by carrying out a normal erase operation, is provided as hardware for realizing a boot block type flash memory, and thus there is a problem as follows.

Namely, in some devices, it is difficult to discriminate whether a boot block type flash memory or normal type flash memory will be accepted in the market place. Therefore, a maker (device supplier) would prefer to provide both types of flash memories, and then determine by the trend in sales thereof which is more suitable for continued production.

In this case, there is no problem if a boot block type flash memory can be changed to a normal type flash memory. However, in the related art boot block type flash memory, the memory cell unit 101 is divided into the main memory block 110 and the boot block 111, the erase circuits 140, 141 and the write circuits 150, 151 are independently provided, and these erase and write circuits are controlled by independent control signals Em, Eb and Wm, Wb. Therefore, if the control signals used to control the boot block erase circuit 141 and the boot block write circuit 151 for the boot block 111 need to be changed in hardware, it is difficult to control these different types of circuits, or a long time is required for development, so that development efficiency is decreased considerably.

Below, the preferred embodiments of a semiconductor memory device according to the present invention will be explained, with reference to the accompanying drawings.

Figure 2A:
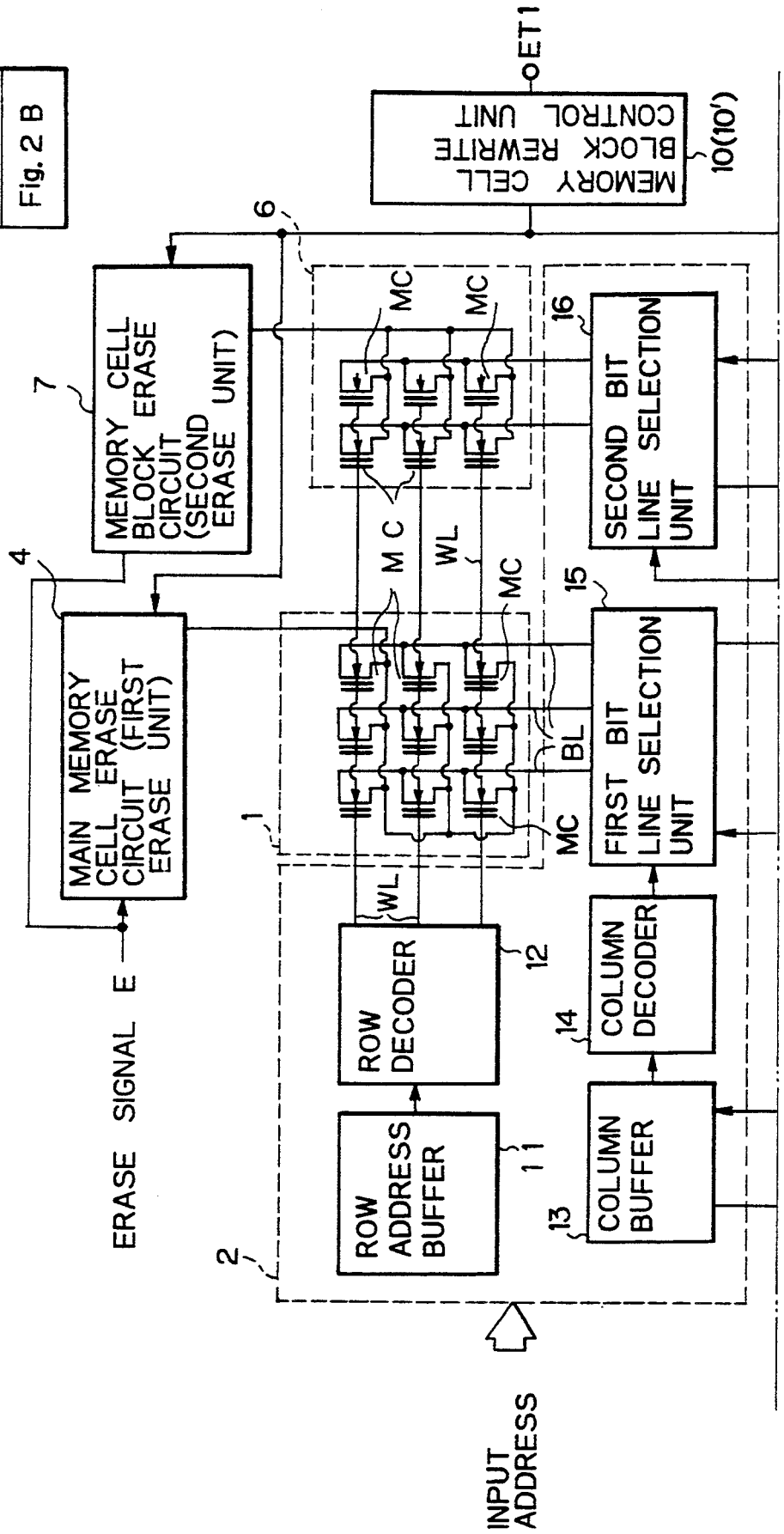
FIG. 2, consisting of FIGS. 2A and 2B, is a block diagram showing a schematic construction of a first embodiment of a semiconductor memory device according to the present invention.
Figure 2B:
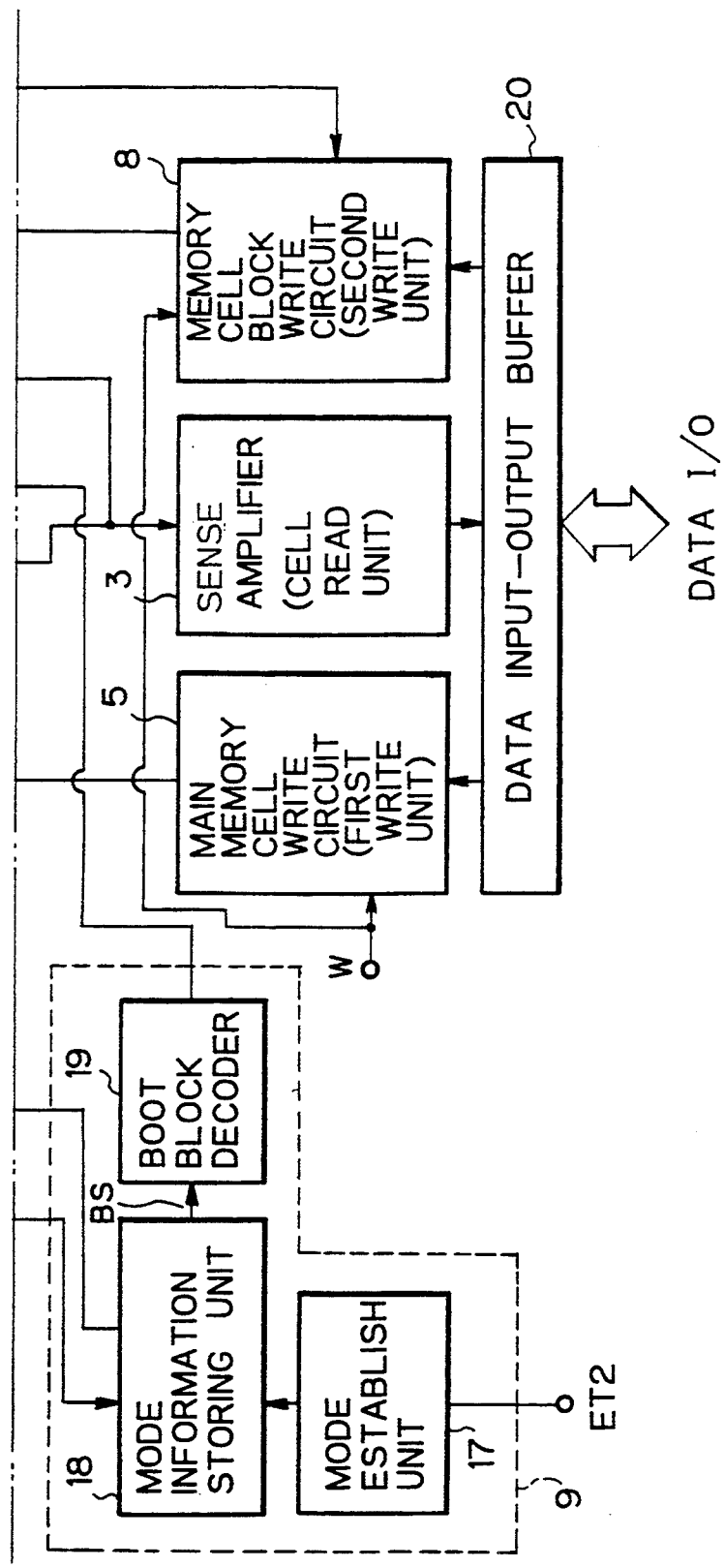

FIG. 2 shows a schematic construction of a first embodiment of a semiconductor memory device (electrically erasable non-volatile semiconductor memory device) according to the present invention. Note, FIG. 2 consists of FIGS. 2A and 2B.

As shown in FIG. 2, a semiconductor memory device (flash memory) of the present embodiment schematically comprises a main memory cell array (first memory cell array) 1, cell selection unit 2, sense amplifier (cell read unit) 3, main memory cell erase circuit (first erase unit) 4, and main memory cell write circuit (first write unit) 5. Further, as shown in FIG. 2, the flash memory of the present embodiment further comprises a memory cell block (second memory cell array) 6, memory cell block erase circuit (second erase unit) 7, memory cell block write circuit (second write unit) 8, operation mode establish unit 9, memory cell block rewrite control unit (second cell array rewrite control unit) 10, and a data input-output buffer 20. As described below in detail, the boot block type flash memory of the present embodiment can be used as a normal type flash memory by making a minimum number of changes in the construction, that is, the flash memory of the present embodiment can be used as a normal type flash memory or a boot block type flash memory.

The main memory cell erase circuit 4 is used to erase information (data) stored in the main memory cell array 1, and the main memory cell write circuit 5 is used to write information into the main memory cell array 1. Further, the memory cell block erase circuit 7 is used to erase information stored in the memory cell block 6, and the memory cell block write circuit 8 is used to write information into the memory cell block 6. The sense amplifier 3 is used to read information stored in the main memory cell array 1 and the memory cell block 6.

As shown in FIG. 2, the cell selection unit 2 comprises a row address buffer 11, row decoder 12, column address buffer 13, column decoder 14, first bit line selection unit 15, and second bit line selection unit 16. The first bit line selection unit 15 is used to select a bit line BL in the main memory cell array 1, and the second bit line selection unit 16 is used to select a bit line BL' in the memory cell block 6. The operation mode establish unit 9 comprises a mode establish unit 17, mode information storing unit 18, and boot block decoder 19. Note, as shown in FIG. 2, in the flash memory of the present embodiment, word lines WL are commonly provided for the memory cell array 1 and the memory cell block 6. Further, the memory cell block rewrite control unit 10 is connected to an external terminal ET1, and the operation mode establish unit 9 (mode establish unit 17) is connected to another external terminal ET2, e.g., address terminals.

Figure 3A:
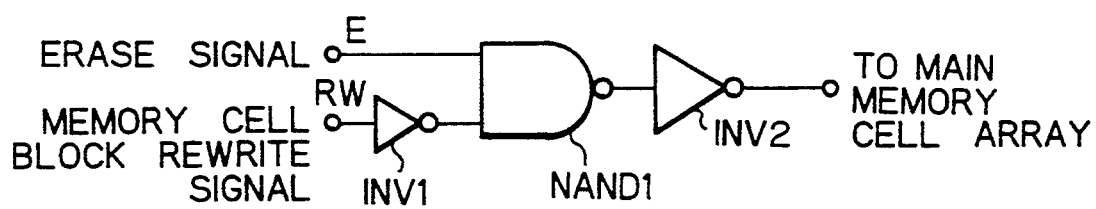
FIG. 3A is a circuit diagram showing an example of the main memory cell erase circuit shown in FIG. 2.
Figure 3B:
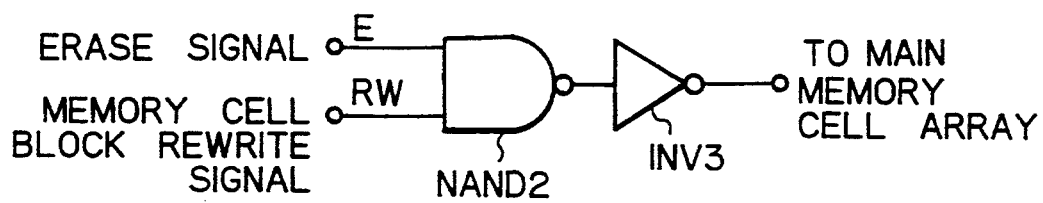
FIG. 3B is a circuit diagram showing an example of the memory cell block erase circuit shown in FIG. 2.

FIG. 3A shows an example of the main memory cell erase circuit 4, and FIG. 3B shows an example of the memory cell block erase circuit 7 shown in FIG. 2.

As shown in FIG. 3A, the main memory cell erase circuit 4 comprises inverters INV1, INV2 and NAND gate NAND1, and inverter INV2. The main memory cell erase circuit 4 is used to erase information stored in the memory cell array 1 in accordance with an erase signal E and memory cell block rewrite signal RW.

As shown in FIG. 3B, the memory cell block erase circuit 7 comprises a NAND gate NAND2 and inverter INV3. The memory cell block erase circuit 7 is used to erase information stored in the memory cell block 6 in accordance with the erase signal E and memory cell block rewrite signal RW. Note, the memory cell block rewrite signal RW is output from the memory cell block rewrite control unit 10.

Figure 4A:
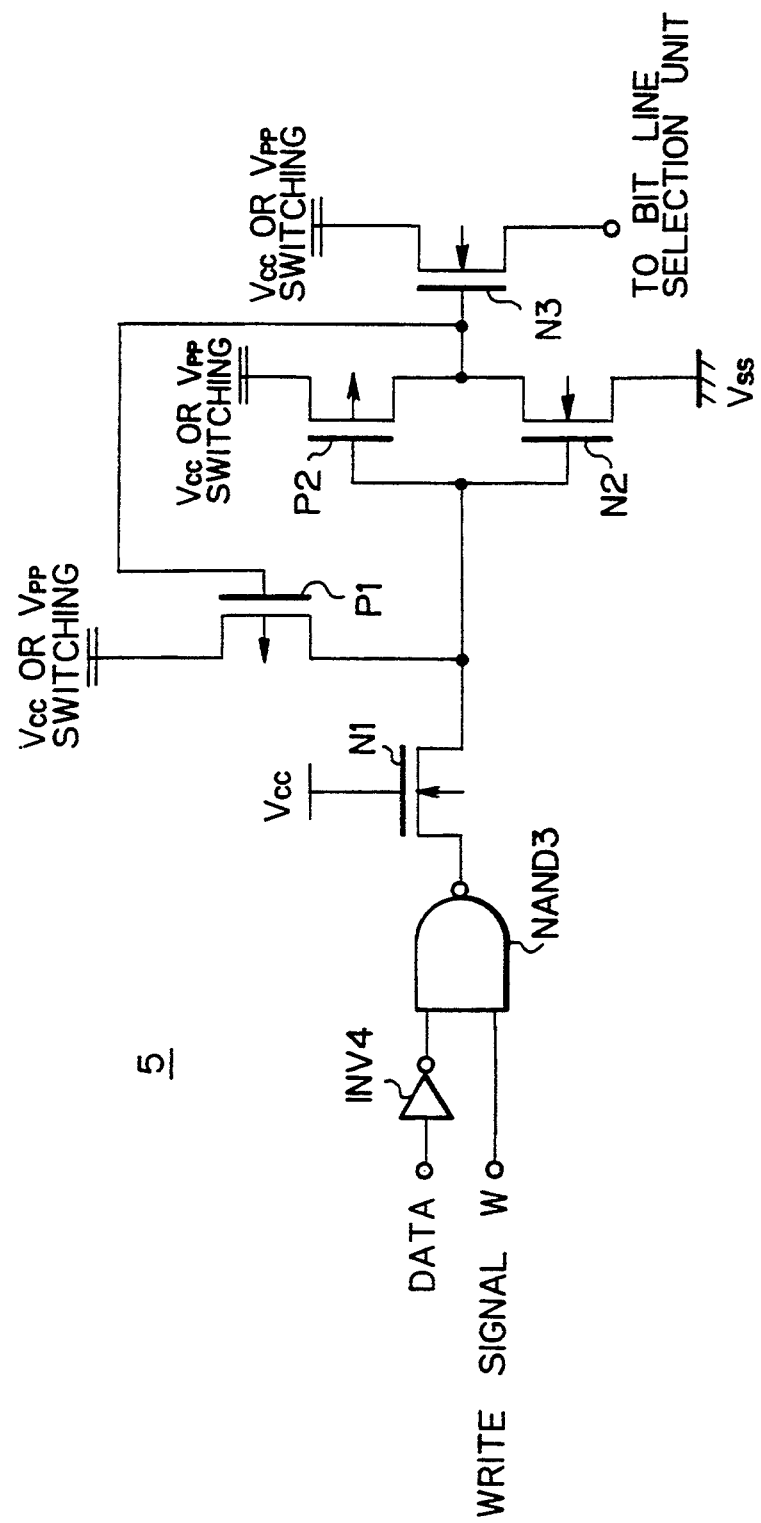
FIG. 4A is a circuit diagram showing an example of the main memory cell write circuit shown in FIG. 2.
Figure 4B:
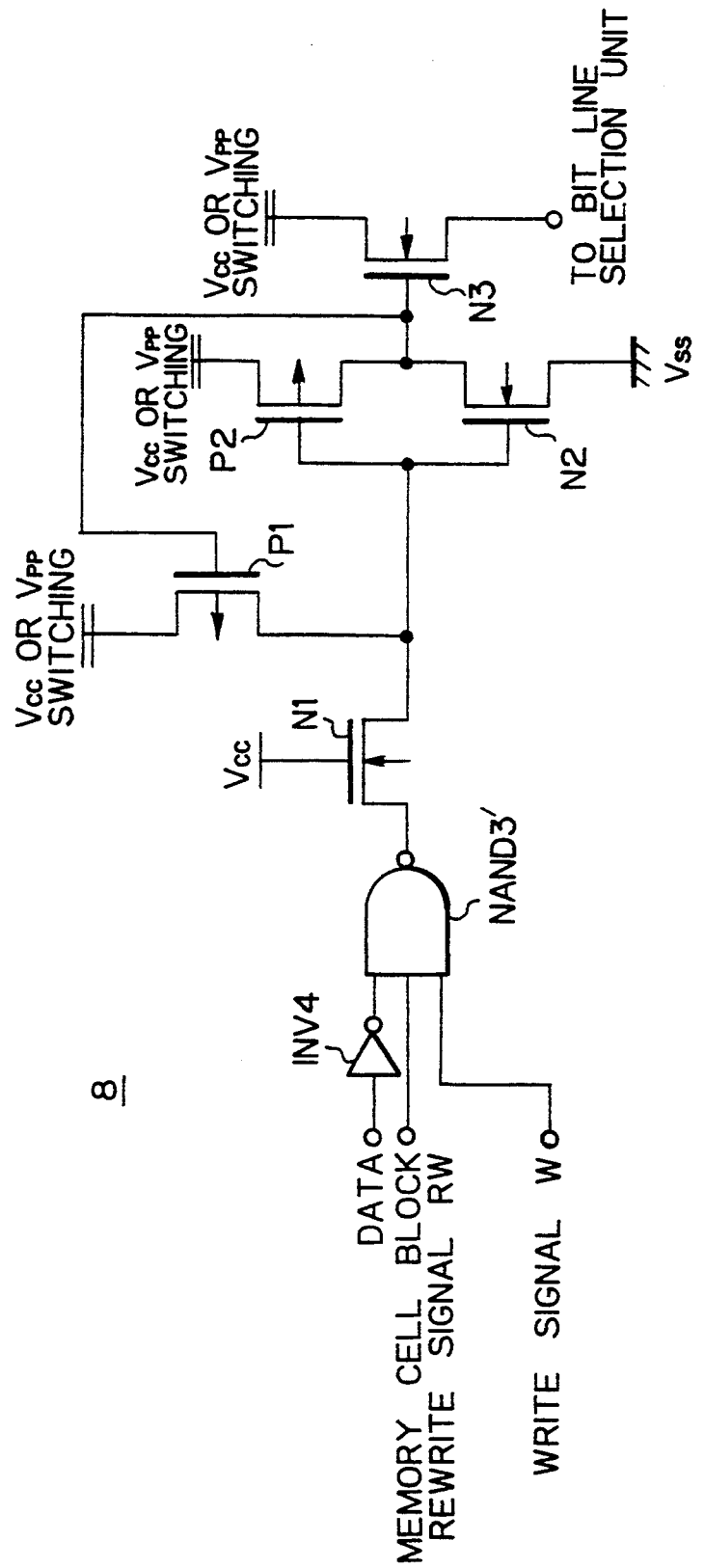
FIG. 4B is a circuit diagram showing an example of the memory cell block write circuit shown in FIG. 2.

FIG. 4A shows an example of the main memory cell write circuit 5, and FIG. 4B shows an example of the memory cell block write circuit 8 shown in FIG. 2.

As shown in FIG. 4A, the main memory cell write circuit 5 comprises an inverter INV4, NAND gate NAND3, N-channel type MOS transistors N1, N2, N3, and P-channel type MOS transistors P1, P2. The main memory cell write circuit 5 is used to write information into the memory cell array 1 through the first bit line selection unit 15 in accordance with a write signal W and data (information).

As shown in FIG. 4B, the memory cell block write circuit 8 comprises an inverter INV4, NAND gate NAND3', N-channel type MOS transistors N1, N2, N3, and P-channel type MOS transistors P1, P2. The memory cell block write circuit 8 is used to write information into the memory cell block 6 through the second bit line selection unit 16 in accordance with the write signal W, memory cell block rewrite signal RW and data (information).

Note, the NAND gate NAND3 of the main memory cell write circuit 5 has two inputs receiving the write signal W and data, but the NAND gate NAND3' of the memory cell block write circuit 8 has three inputs receiving the write signal W, memory cell block rewrite signal RW and data. Further, the data input into the NAND gates NAND3 or NAND3' are output from the data input-output buffer 20.

Figure 5:
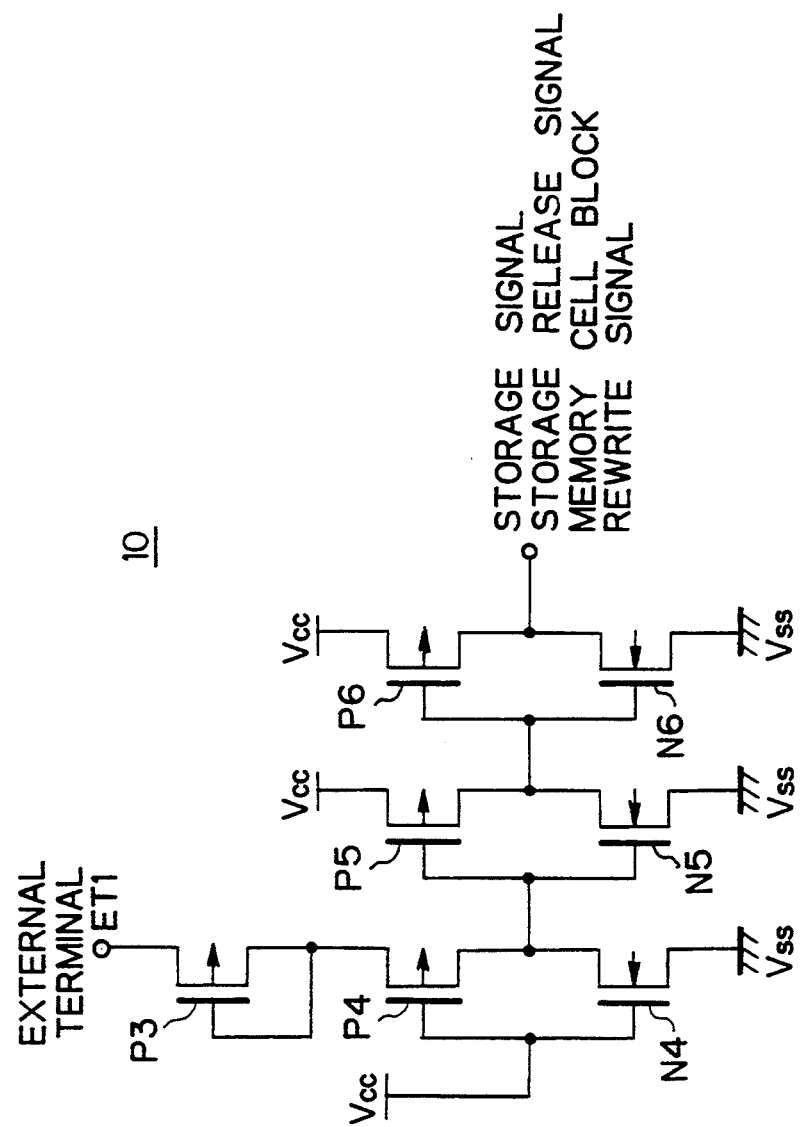
FIG. 5 is a circuit diagram showing an example of the memory cell block rewrite control unit shown in FIG. 2.

FIG. 5 shows an example of the memory cell block rewrite control unit 10 shown in FIG. 2.

As shown in FIG. 5, the memory cell block rewrite control unit 10 comprises P-channel type MOS transistors P3, P4, P5, P6, and N-channel type MOS transistors N4, N5, N6. Note, this memory cell block rewrite control unit 10 constitutes a high voltage detection circuit to detect a high voltage applied to the external terminal ET1. Further, the N-channel type MOS transistor N4 is formed by a small size transistor. In addition, the external terminal ET1 may be specified as an address terminal (for example, address terminal for a least significant bit) which is not used in the case of accessing the memory cell block 6.

Therefore, when a high voltage (for example, 8 volts) higher than a power supply voltage Vcc (for example, 5 volts) is applied to the external terminal ET1, a potential of a node AA is brought to a high level Note, the output signal of the memory cell block rewrite control unit 10 corresponds to a storage signal, storage release signal, or memory cell block rewrite signal.

Figure 6:
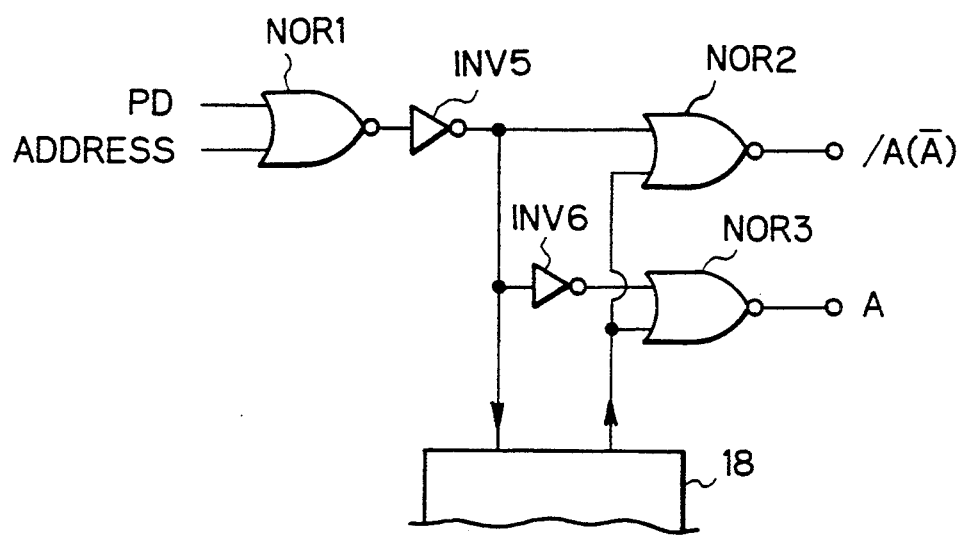
FIG. 6 is a circuit diagram showing an example of the column address buffer shown in FIG. 2.

FIG. 6 shows an example of the column address buffer 13 shown in FIG. 2.

As shown in FIG. 6, the column address buffer 13 comprises NOR gates NOR1, NOR2, NOR3, and inverters INV5, INV6. The column address buffer 13 receives an address signal and signal PD, and the column address buffer 13 outputs an address signal A, /A (where, the signal/A denotes an inverted signal of the signal A) to the column decoder 14 or boot block decoder 19 in accordance with an operation mode information stored in the mode information storing unit 18.

Figure 7:
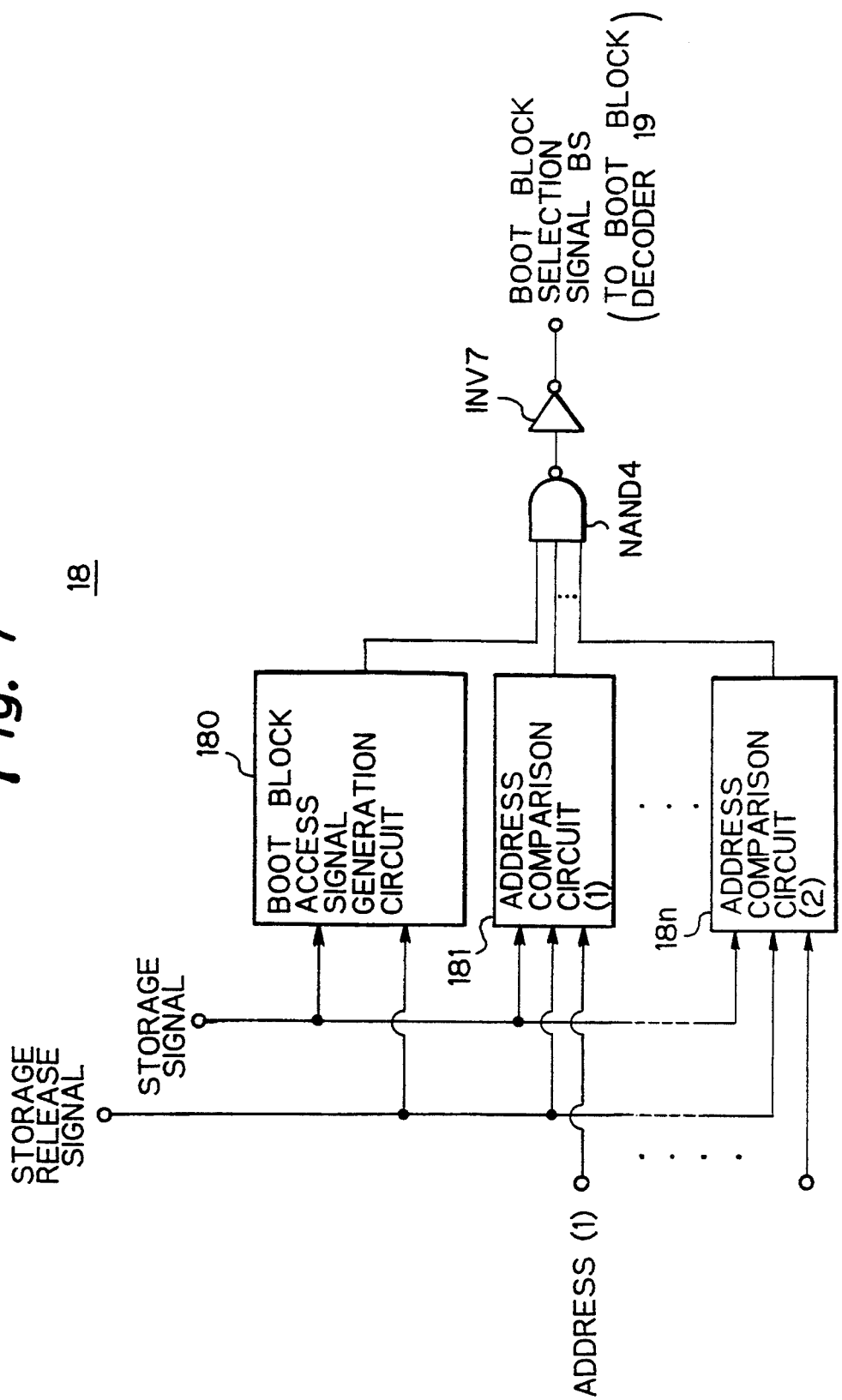
FIG. 7 is a block diagram showing an example of the mode information storing unit shown in FIG. 2.

FIG. 7 shows an example of the mode information storing unit 18 shown in FIG. 2.

As shown in FIG. 7, the mode information storing unit 18 comprises a boot block access signal generation circuit 180, address comparison circuits 181, ..., 18n, NAND gate NAND 4, and inverter INV7. The mode information storing unit 18 compares n-bit addresses in accordance with a storage release signal (first operation mode) and storage signal (second operation mode) input from the mode establish unit 17, and outputs a boot block selection signal BS. Note, the n-bit addresses are a part of the total addresses and correspond to those of the boot block (memory cell block 6). Further, the first operation mode corresponds to the flash memory of the present embodiment as a normal type flash memory, and the second operation mode corresponds to the flash memory of the present embodiment as a boot block type flash memory.

Figure 8:
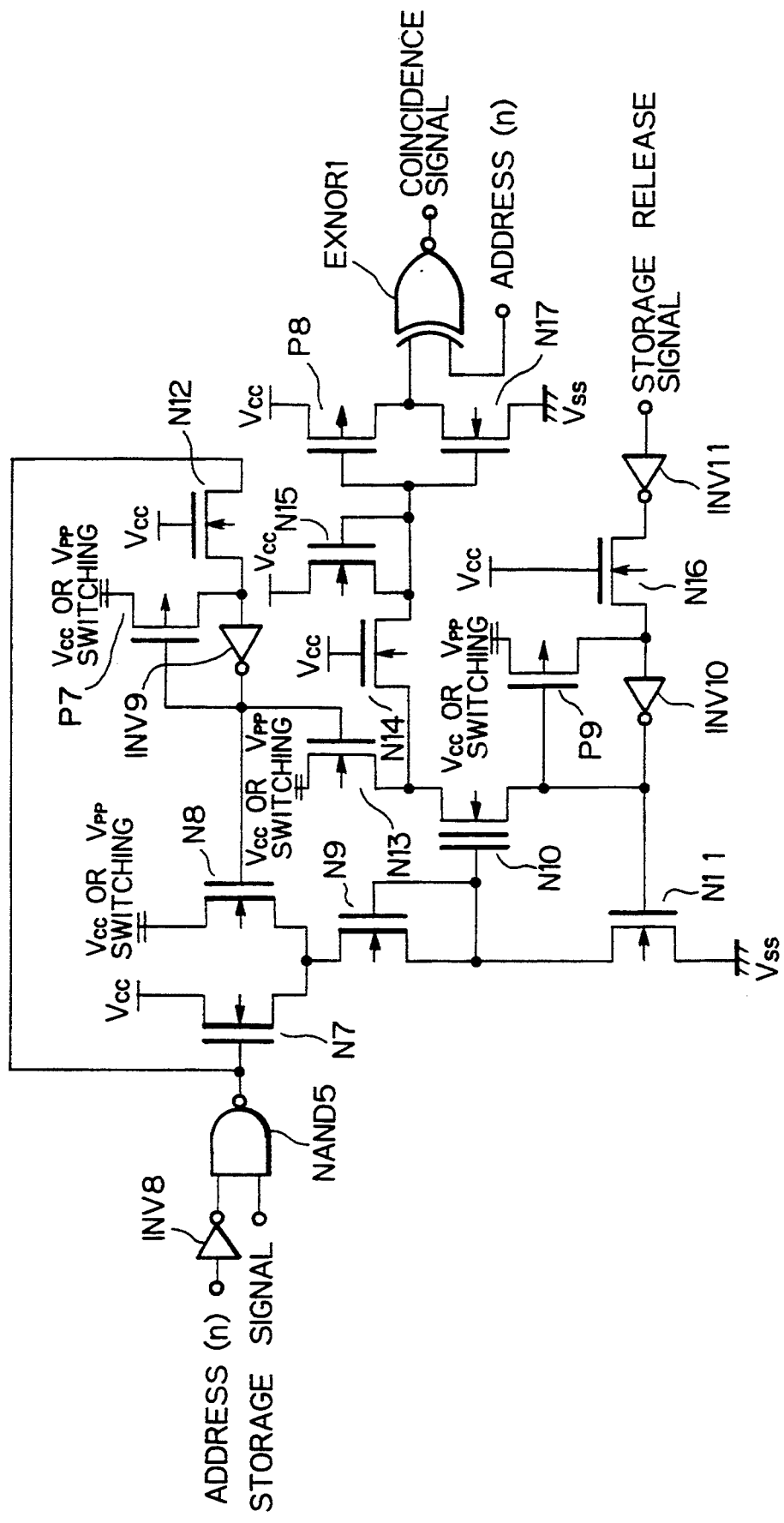
FIG. 8 is a circuit diagram showing a main portion of the mode information storing unit shown in FIG. 7.

FIG. 8 shows a main portion of the mode information storing unit 18 shown in FIG. 7, that is, FIG. 8 shows an example of the address comparison circuit 181 (181, ..., 18n).

As shown in FIG. 8, the address comparison circuit 181 comprises a NAND gate NAND5, EXNOR gate EXNOR1, inverters INV8 to INV11, P-channel type MOS transistors P7 to P9, and N-channel type MOS transistors N7 to N17. Note, the N-channel type MOS transistor N10 is formed by a memory cell transistor to previously store boot block address information (for example, specific n-bit addresses), and the address comparison circuit 181 compares whether or not an input address signal (for example, n-bit addresses of the total input addresses) is coincident with the boot block address information stored in each transistor N10 of the address comparison circuits 181, ..., 18n.

When the input address signal (n-bit addresses of the total input addresses) is coincident with the boot block address information stored in the mode information storing unit 18, a bit line BL of the main memory cell array 1 is not selected, but a bit line BL' of the memory cell block 6 is selected. Note, row addresses are commonly used in the main memory cell array 1 and the memory cell block 6, that is, word lines WL are commonly used in the main memory cell array 1 and the memory cell block 6.

When rewriting to the memory cell block 6, the memory cell block rewrite control unit 10 generates a memory cell block rewrite signal RW. In this case, when carrying out an erase operation, the memory cell block erase circuit 7 is activated, and the erase operation of the memory cell block 6 is carried out, so that information stored in all memory cells MC of the memory cell block 6 are electrically and collectively erased. Note, the memory cell block rewrite signal RW is determined as a negating signal of the erase operation of the main memory cell array 1.

When carrying out a write operation, in the state of generating the memory cell block rewrite signal RW, a specific boot block address signal is input. In this case, a bit line of the memory cell block 6 is selected by the boot block decoder 19, and the write operation of the memory cell block 6 is carried out by operating the memory cell block write circuit 8.

Figure 9:
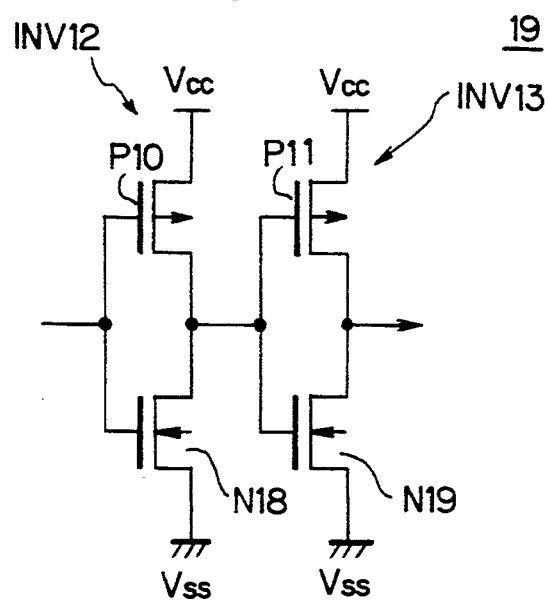
FIG. 9 is a circuit diagram showing an example of the boot block decoder shown in FIG. 2.

FIG. 9 shows an example of the boot block decoder shown in FIG. 2.

As shown in FIG. 9, the boot block decoder 19 comprises P-channel type MOS transistors P10, P11, and N-channel type MOS transistors N18, N19, that is, the boot block decoder 19 comprises two stage of inverters INV12, INV13. An output of the mode information storing unit 18 is input into the boot block decoder 19, and an output of the boot block decoder 19 is input into the second bit line selection unit 16.

In the above described embodiment of the semiconductor memory device according to the present invention, first, a specific mode is established by the mode establishing unit 17, for example, when the mode for using the memory cell block 6 as a boot block, a second operation mode is stored in the mode information storing unit 18. In this state, when an address signal is input, this input address is compared with the boot block address information (for example, specific n-bit addresses) which is previously stored in the address comparison circuits 180, ..., 18n of the mode information storing unit 18. Further, when the input address signal is coincident with the boot block address information, a bit line BL' of the memory cell block 6 is selected.

Note, in this case, information (data) of main memory cell array 1 can be read, but the rewrite operation cannot be carried out, as the erase and write operations of the memory cell block 6 are independently carried out from that of the main memory cell array 1. Further, in the mode information storing unit 18, the second operation mode may be stored by fixing the input of the address n at a low level "L". In addition, the first operation mode corresponds to the flash memory of the present invention as a normal type flash memory, and the second operation mode corresponds to the flash memory of the present invention as a boot block type flash memory.

Therefore, the change between the boot block type flash memory and normal type flash memory can be easily realized by changing the operation mode to a specific required mode by the operation mode establish unit 9, or by only changing the establish value of the operation mode establish unit 9.

In the above described embodiment, the boot block information (specific address) is stored by using memory cell transistor(s) N10 of the address comparison circuits 181 (181, ..., 18n), but a fuse element F1 can be used to store the boot block information. Note, as in the above embodiment, when using the memory cell transistor to store the boot block information, the information (data) stored in the memory cell transistor N10 of the address comparison circuit 181 (181, ..., 18n) is constituted to be rewritten, so that a memory area of the main memory cell array 1 used for changing the boot block (memory cell block 6) can be changed. On the other hand, when using the fuse element to store the boot block information, a memory area of the main memory cell array 1 used for changing the boot block is fixed and cannot be changed. Note, when using a fuse element to store the boot block information, the fuse element can be formed by a master-slice of metal wiring, and thus the developing processes can be decreased even more.

Figure 10:
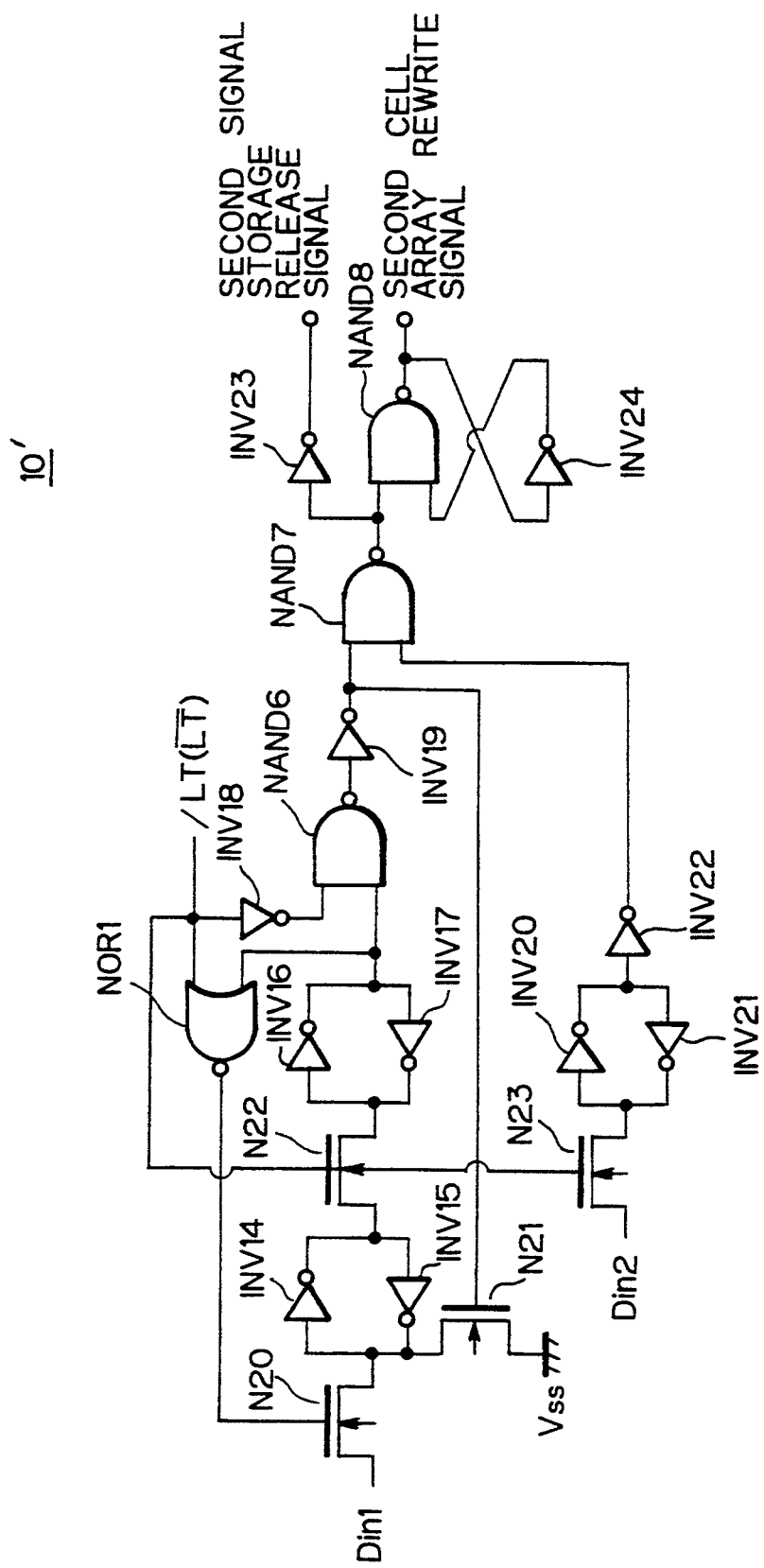
FIG. 10 is a circuit diagram showing another example of the second cell array rewrite control unit shown in FIG. 2.

FIG. 10 shows another example of the memory cell block rewrite control unit (10') shown in FIG. 2, and FIG. 11 shows a waveform diagram for explaining an operation of the memory cell block rewrite control unit 10' shown in FIG. 10.

As shown in FIG. 10, the memory cell block rewrite control unit 10' comprises a NOR gate NOR1, NAND gates NAND6, NAND7, NAND8, inverters INV14 to INV24, and N-channel type MOS transistors N20 to N23. Note, this memory cell block rewrite control unit 10' constitutes a sequential circuit having a plurality of latch circuits (INV14, INV15; INV16, INV17; INV 20, INV21; NAND8, INV24).

The memory cell array rewrite signal RW (storage signal, storage release signal) is generated by applying a high voltage to a specific external terminal, but in this memory cell block rewrite control unit 10' shown in FIG. 10, the memory cell array rewrite signal RW is generated by inputting a special command.

Concretely, for example, as shown in FIG. 11, in the memory cell block rewrite control unit 10', when specific data Din1, Din2 are continuously input, the memory cell array rewrite signal RW is generated from the memory cell block rewrite control unit 10'. Namely, each operation of the main memory cell array 1 and the memory cell block 6 is controlled by continuously inputting data signals Din1, Din2 of high levels "H" and signal/LT (where, the signal/LT denotes an inverted signal of a latch signal LT). Note, the data signal Din1 is input through an external terminal ET3, and the data signal Din2 is input through an external terminal ET4.

In the above embodiments of the present invention, the main memory cell erase circuit 4, main memory cell write circuit 5, memory cell block erase circuit 7, memory cell block write circuit 8, and the like can be modified as various circuit configurations.

As explained above, in the semiconductor memory device according to the present invention, a main memory cell array used for a normal type flash memory and a memory cell block used for a boot block type flash memory are provided, and an operation mode is established as a required mode in accordance with an operation mode establish unit. Namely, according to the present invention, the change between the boot block type flash memory and the normal type flash memory can be realized by only changing an establish value of the operation mode establish unit.

Consequently, when developing both boot block type flash memory and normal type flash memory, these two types of flash memories can be obtained by using the same chip or by carrying out only minimum changes, so that the developing processes can be greatly decreased.

Many different embodiments of the present invention may be constructed without departing from the spirit and scope of the present invention, and it should be understood that the present invention is not limited to the specific embodiments described in this specification, except as defined in the appended claims.

I claim:

1. An electrically erasable non-volatile semiconductor memory device comprising:
   a memory cell array having a plurality of memory cells;
   a first erase means for erasing information stored in said memory cell array;
   a second erase means for erasing information stored in said memory cell array, and the erasing operation of said second erase means being independently carried out of the erasing operation of said first erase means; and
   an operation mode establish means for establishing one operation mode from first and second operation modes; wherein:
   when said first operation mode is established, said second erase means is inactivated, and the erasing operation of said memory cell array is only carried out by said first erase means; and
   when said second operation mode is established, the erasing operation of said first erase means for a part of said memory cell array is disable, and said second erase means is activated and the erasing operation for the part of said memory cell array is carried out by said second erase means.

2. An electrically erasable non-volatile semiconductor memory device as claimed in claim 1, wherein:
   said memory cell array comprises a first memory cell array having a predetermined storage capacity and including a plurality of memory cells, and a second memory cell array having a predetermined storage capacity smaller than that of said first memory cell array, for replacing an optional address area of said first memory cell array;
   said electrically erasable non-volatile semiconductor memory device further comprises a cell selection means, connected to said first memory cell array and said second memory cell array, for selecting a memory cell in said first memory cell array or said second memory cell array; a cell read means, connected to said cell selection means, for reading information from the memory cell selected by said cell selection means; a first write means, connected to said cell selection means, for writing information into the memory cell selected by said cell selection means; and a second write means, connected to said cell selection means, for writing information into said second memory cell array;
   said operation mode establish means is connected to said cell selection means and used to establish one operation mode from first and second operation modes, said first operation mode only using said first memory cell array, and said second operation mode using both of said first memory cell array and said second memory cell array;

when said first operation mode is established by said operation mode establish means, said cell selection means only accesses said first memory cell array as a selection target; and when said second operation mode is established by said operation mode establish means, the optional address area of said first memory cell array is replaced by said second memory cell array as a boot block, and said cell selection means accesses both of said first memory cell array and said second memory cell array.

3. An electrically erasable non-volatile semiconductor memory device as claimed in claim 2, wherein said semiconductor memory device further comprises an activation means for controlling the activation of said second erase means and said second write means.

4. An electrically erasable non-volatile semiconductor memory device as claimed in claim 3, wherein said activation means is connected to an external terminal, and when a high voltage higher than a normal high power supply voltage is applied to said external terminal, said activation means controls said first erase means to be inactivated, and said second erase means and said second write means to be activated, and thereby a rewrite operation of said second memory cell array is carried out.

5. An electrically erasable non-volatile semiconductor memory device as claimed in claim 3, wherein said activation means is connected to external terminals, and when specific data are continuously applied to said external terminals, said activation means controls said first erase means to be inactivated, and said second erase means and said second write means to be activated, and thereby a rewrite operation of said second memory cell array is carried out.

6. An electrically erasable non-volatile semiconductor memory device as claimed in claim 2, wherein said cell selection means comprises a row address buffer, row decoder connected to said row address buffer for selecting a word line of said first memory cell array and said second memory cell array, column address buffer, column decoder connected to said column address buffer, first bit line selection unit connected to said first memory cell array for selecting a bit line in said first memory cell array, and second bit line selection unit connected to said second memory cell array for selecting a bit line in said second memory cell array.

7. An electrically erasable non-volatile semiconductor memory device as claimed in claim 6, wherein said cell read means is connected to said first bit line selection unit and said second bit line selection unit, said first write means is connected to said first bit line selection unit, and said second erase means is connected to said second bit line selection unit.

8. An electrically erasable non-volatile semiconductor memory device as claimed in claim 6, wherein said operation mode establish means comprises a mode establish unit connected to an external terminal, mode information storing unit connected to said mode establish unit and said column address buffer for storing mode information, and boot block decoder connected to said mode information storing unit and said second bit line selection unit.

9. An electrically erasable non-volatile semiconductor memory device as claimed in claim 8, wherein said mode information storing unit compares n-bit addresses in accordance with a storage release signal or storage signal input from said mode establish unit.

10. An electrically erasable non-volatile semiconductor memory device as claimed in claim 9, wherein said mode information storing unit includes address comparison circuits each having a memory cell transistor for comparing whether or not an input address is coincident with boot block address information stored in said memory cell transistor.

11. An electrically erasable non-volatile semiconductor memory device as claimed in claim 9, wherein said mode information storing unit includes address comparison circuits each having a fuse element for comparing whether or not an input address is coincident with boot block address information determined by said fuse element.

* * * * *